United States Patent
Kuga

(10) Patent No.: US 8,778,133 B2
(45) Date of Patent: Jul. 15, 2014

(54) METHOD AND APPARATUS FOR PEELING PROTECTIVE TAPE

(71) Applicant: Shoichi Kuga, Chiyoda-ku (JP)

(72) Inventor: Shoichi Kuga, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/715,218

(22) Filed: Dec. 14, 2012

(65) Prior Publication Data

US 2013/0098542 A1 Apr. 25, 2013

Related U.S. Application Data

(62) Division of application No. 12/979,844, filed on Dec. 28, 2010, now abandoned.

(30) Foreign Application Priority Data

Mar. 10, 2010 (JP) ................................. 2010-053447

(51) Int. Cl.
*B32B 38/10* (2006.01)
*B65H 3/32* (2006.01)

(52) U.S. Cl.
CPC ............... *B65H 3/32* (2013.01); *Y10S 156/932* (2013.01); *Y10S 156/943* (2013.01)
USPC ............ 156/716; 156/765; 156/932; 156/943

(58) Field of Classification Search
None
See application file for complete search history.

(56) References Cited

U.S. PATENT DOCUMENTS

| 5,891,298 A | 4/1999 | Kuroda et al. |
| 6,505,395 B1 * | 1/2003 | Farnworth et al. ............... 29/559 |
| 7,240,422 B2 | 7/2007 | Cheung et al. |
| 7,798,195 B2 * | 9/2010 | Kobayashi et al. ............ 156/758 |
| 2005/0205204 A1 * | 9/2005 | Kurosawa et al. ............ 156/344 |
| 2008/0121335 A1 | 5/2008 | Kiuchi et al. |
| 2009/0107634 A1 | 4/2009 | Kanazawa |

FOREIGN PATENT DOCUMENTS

JP 2003-209082 7/2003

(Continued)

OTHER PUBLICATIONS

Office Action issued Jun. 25, 2013 in Japanese Application No. 2010-053447 (With Partial English Translation).

(Continued)

*Primary Examiner* — Mark A Osele
*Assistant Examiner* — Nickolas Harm
(74) *Attorney, Agent, or Firm* — Oblon, Spivak, McClelland, Maier & Neustadt, L.L.P.

(57) ABSTRACT

A method of peeling a protective tape, includes the steps of mounting a wafer on a stage, the wafer having the protective tape adhered thereto so that the protective tape overlaps only a portion of a notch of the wafer, attaching a peeling adhesive tape to the protective tape, projecting a lift pin from the stage so that the portion of the protective tape which overlaps the notch is raised by a top surface of the lift pin, and with the protective tape raised by the lift pin, pulling the peeling adhesive tape so as to peel the protective tape from the wafer. The top surface of the lift pin has a shape that allows the top surface to raise the portion of the protective tape which overlaps the notch.

3 Claims, 8 Drawing Sheets

(56) References Cited

FOREIGN PATENT DOCUMENTS

| | | |
|---|---|---|
| JP | 2003-338478 | 11/2003 |
| JP | 2004-128147 | 4/2004 |
| JP | 2007-311735 | 11/2007 |
| JP | 2008-135662 | 6/2008 |
| JP | 2009-141314 | 6/2009 |
| TW | 200719394 A1 | 5/2007 |

OTHER PUBLICATIONS

German Office Action issued Apr. 25, 2012 in Patent Application No. 10 2011 004 155.9 with English Translation.

Combined Taiwanese Office Action and Search Report issued Jun. 26, 2013, in Taiwanese Patent Application No. 099146152 with English translation.

* cited by examiner

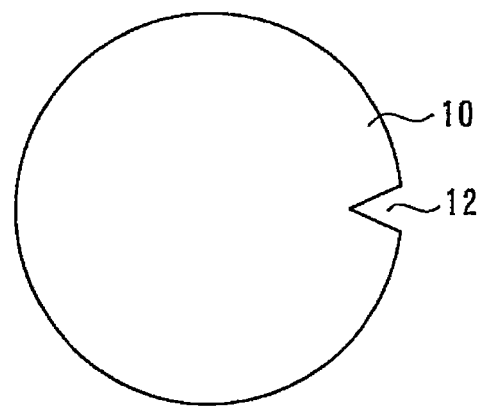
F I G. 1
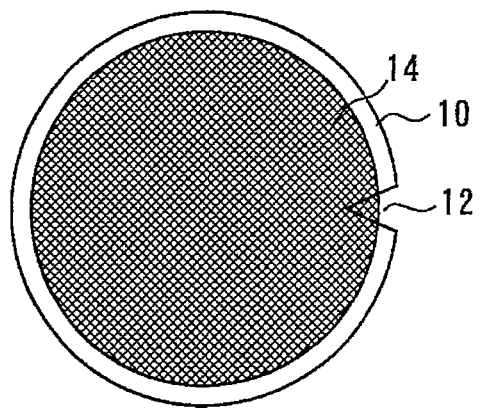
F I G. 2

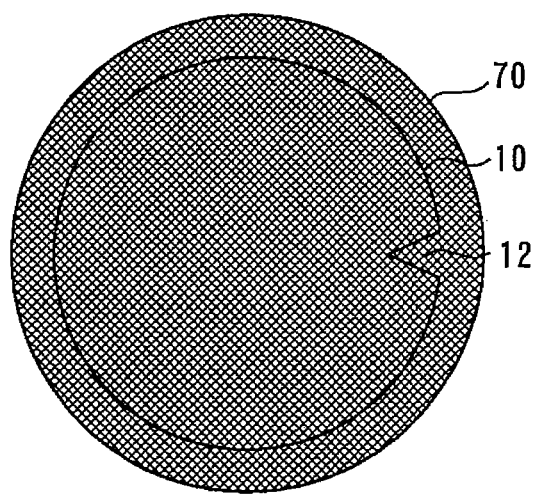
F I G. 1 4
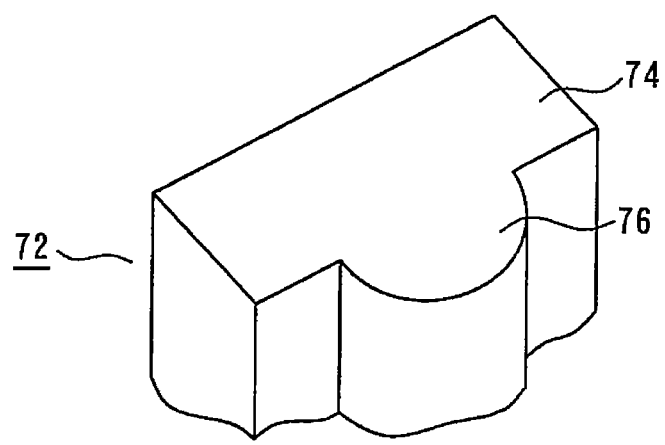
F I G. 1 5

METHOD AND APPARATUS FOR PEELING PROTECTIVE TAPE

CROSS REFERENCE TO RELATED APPLICATIONS

This application is a divisional application of U.S. patent application Ser. No. 12/979,844, filed on Dec. 28, 2010, and is based upon and claims the benefit of priority from Japanese Patent Application No. 2010-053447, filed on Mar. 10, 2010, the entire contents of which are herein incorporated by reference,

BACKGROUND OF THE INVENTION

1. Field of the Invention

The present invention relates to a method and apparatus for peeling a protective tape adhered to a wafer.

2. Background Art

A need exists to reduce the size of semiconductor electronic devices, as well as to increase their functionality and reduce their power consumption. There is a practice of grinding down the thickness of a wafer in order to reduce the size of the semiconductor electronic devices. When a wafer is ground to a reduced thickness, a protective tape is attached to the wafer surface for protection. The ground wafer is subjected to subsequent processes without removing the protective tape, which tape serves to increase the strength of the wafer. That is, the protective tape also enhances the strength of the wafer, allowing safe handling of the wafer. This protective tape is eventually peeled off or removed by a protective tape peeling apparatus. Specifically, a peeling adhesive tape is attached to the protective tape and is pulled away from the wafer, thereby peeling the protective tape with the peeling adhesive tape thereon from the wafer.

When the patterns on the wafer surface have little or no steps, the adhesion between the wafer surface and the protective tape is high. This means that the protective tape may have lower adhesion to the peeling adhesive tape than to the wafer surface. It has been found that this may result in the peeling adhesive tape peeling away from the protective tape when the peeling adhesive tape is pulled away from the wafer, thus preventing the removal of the protective tape from the wafer surface. In order to solve this problem, a method is proposed in which the protective tape is peeled off while the portion of the tape extending over the notch of the wafer is lifted away from the wafer surface by stress applying means.

It should be noted, however, that the protective tape attached to the wafer surface may not extend exactly to the peripheral edge of the wafer. For example, the protective tape may be attached only to a radially inner portion of the wafer surface. In such cases, there is only a very small overlap between the protective tape and the notch of the wafer, making it impossible to lift the overlapping portion of the protective tape away from the wafer surface by stress applying means.

Further, the protective tape may be attached to the wafer surface so that it extends outwardly beyond the peripheral edge of the wafer. In such cases, the protective tape cannot be sufficiently raised by pushing the portion of the protective tape overlapping the notch of the wafer by stress applying means. Thus, it has been found that the protective tape may not be able to be removed from the wafer if the tape extends short of the peripheral edge of the wafer (i.e., it does not fully cover the peripheral portion of the surface of the wafer) or if the tape extends outwardly beyond the peripheral edge.

SUMMARY OF THE INVENTION

The present invention has been made to solve the above problems. It is, therefore, an object of the present invention to provide a protective tape peeling method and apparatus which allow easy removal of a protective tape adhered to the surface of a wafer even if the tape extends short of or beyond the peripheral edge of the wafer.

According to one aspect of the present invention, a method of peeling a protective tape, includes the steps of mounting a wafer on a stage, the wafer having the protective tape adhered thereto so that the protective tape overlaps only a portion of a notch of the wafer, attaching a peeling adhesive tape to the protective tape, projecting a lift pin from the stage so that the portion of the protective tape which overlaps the notch is raised by a top surface of the lift pin, and with the protective tape raised by the lift pin, pulling the peeling adhesive tape so as to peel the protective tape from the wafer. The top surface of the lift pin has a shape that allows the top surface to raise the portion of the protective tape which overlaps the notch.

According to another aspect of the present invention, a method of peeling a protective tape, includes the steps of mounting a wafer having the protective tape adhered thereto on a stage, the protective tape having a first portion covering a notch of the wafer, the protective tape also having a second portion extending outwardly from a peripheral edge of the wafer, attaching a peeling adhesive tape to the protective tape, projecting a lift pin from the stage so that the first and second portions are raised by a top surface of the lift pin, and with the protective tape raised by the lift pin, pulling the peeling adhesive tape so as to peel the protective tape from the wafer. The top surface of the lift pin has a narrow portion and a wide portion so that the first portion is raised by the narrow portion and the second portion is raised by the wide portion.

According to another aspect of the present invention, a protective tape peeling apparatus includes a stage on which a wafer is mounted, the wafer having a protective tape adhered thereto so that the protective tape overlaps only a portion of a notch of the wafer, means for attaching a peeling adhesive tape to the protective tape, means for peeling the peeling adhesive tape, and a lift pin projectably mounted in the stage. A top surface of the lift pin has a shape that allows the top surface to raise the portion of the protective tape which overlaps the notch.

According to another aspect of the present invention, a protective tape peeling apparatus includes a stage on which a wafer having a protective tape adhered thereto is mounted, the protective tape having a first portion covering a notch of the wafer, the protective tape also having a second portion extending outwardly from a peripheral edge of the wafer, means for attaching a peeling adhesive tape to the protective tape, means for peeling the peeling adhesive tape, and a lift pin projectably mounted in the stage. A top surface of the lift pin has a narrow portion and a wide portion so that the first portion can be raised by the narrow portion and the second portion can be raised by the wide portion.

Other and further objects, features and advantages of the invention will appear more fully from the following description.

BRIEF DESCRIPTION OF THE DRAWINGS

FIG. 1 is a plan view of a wafer of the first embodiment;

FIG. 2 is a plan view illustrating the positional relationship between the wafer and a protective tape of the first embodiment;

FIG. 14 is a plan view illustrating the positional relationship between a protective tape and a wafer of the second embodiment;

FIG. 15 is a perspective view of a lift pin of the second embodiment; and

DETAILED DESCRIPTION OF THE PREFERRED EMBODIMENTS

First Embodiment

Figure 3:
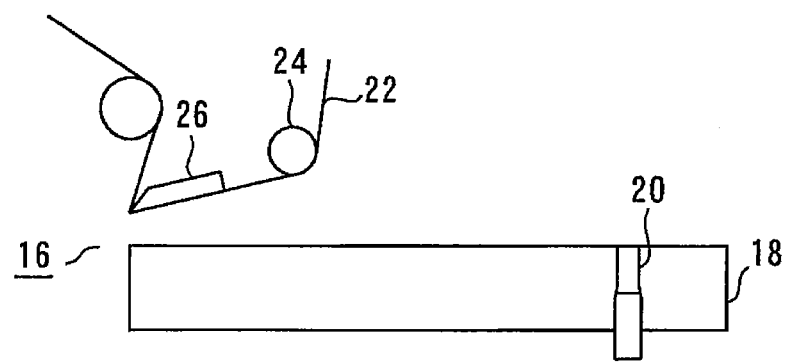
FIG. 3 is a cross-sectional view of a protective tape peeling apparatus of the first embodiment.

With reference to FIGS. 1 to 13, there will be described a method and apparatus for peeling a protective tape according to a first embodiment of the present invention. It should be noted that throughout the description of the first embodiment certain of the same or corresponding components are designated by the same reference numerals and described only once. This also applies to other embodiments of the invention subsequently described.

FIG. 1 is a plan view of a wafer 10 of the first embodiment. The peripheral edge of the wafer 10 has a notch 12. The notch 12 is used to determine the crystal orientation of the wafer 10 and to position the wafer 10.

FIG. 2 is a plan view illustrating the positional relationship between the wafer 10 and a protective tape 14 of the first embodiment. The corners of the wafer 10 are chamfered by a grinder, etc. to increase the strength of the wafer 10 and prevent a crack or break in the edge of the wafer 10 due to impact applied thereto. In order to allow for this chamfering, the protective tape 14 adhered to the surface of the wafer 10 does not cover the outer approximately 0.5-1.0 mm of the wafer surface, for example. (Attachment of a protective tape in this manner is hereinafter referred to as "inner tape attachment.") As a result, the protective tape 14 overlaps only a portion of the notch 12; it does not entirely cover the notch 12.

Figure 4:
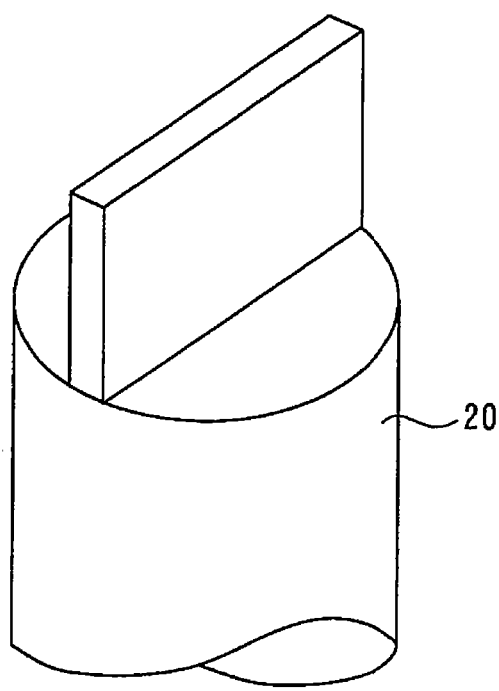
FIG. 4 is a perspective view of the lift pin of the first embodiment.

FIG. 3 is a cross-sectional view of a protective tape peeling apparatus 16 of the first embodiment. The protective tape peeling apparatus 16 includes a stage 18 on which the wafer 10 is mounted, and a lift pin 20 projectably mounted in the stage 18. The lift pin 20 is used to raise the protective tape 14. Further, the lift pin 20 can be retracted into the stage 18, as shown in FIG. 3. FIG. 4 is a perspective view of the lift pin 20 of the first embodiment. The lift pin 20 has a rectangular top surface.

The protective tape peeling apparatus 16 further includes means for attaching a peeling adhesive tape 22 to the protective tape 14. This means includes a roller 24 and a squeegee 26 for supporting the peeling adhesive tape 22. It should be noted that this means for attaching the peeling adhesive tape 22 also serves as means for peeling the peeling adhesive tape 22.

Figure 5:
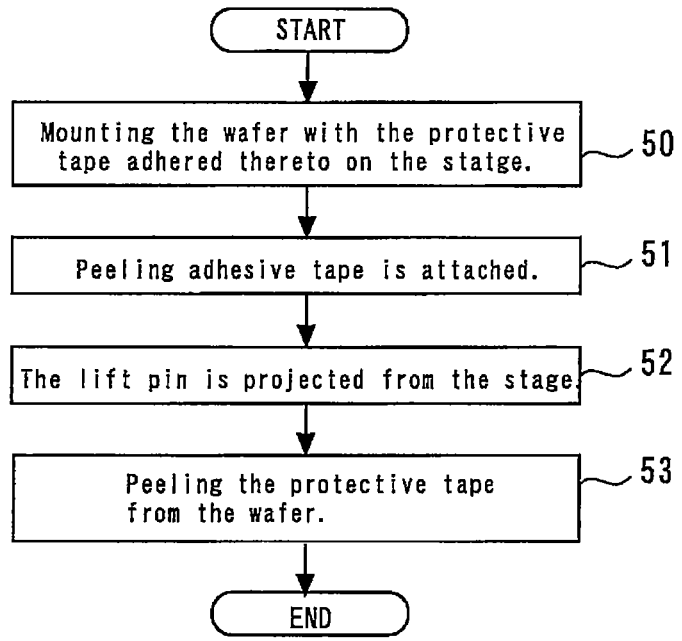
FIG. 5 is a flowchart illustrating a protective tape peeling method of the first embodiment.

FIG. 5 is a flowchart illustrating a protective tape peeling method of the first embodiment. The protective tape peeling method will be described with reference to this flowchart.

Figure 6:
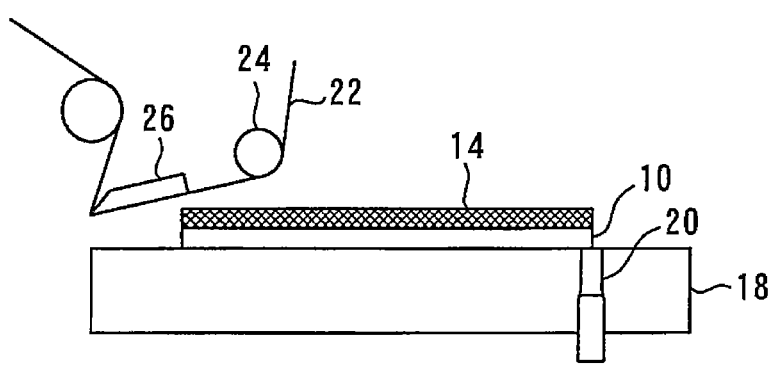
FIG. 6 shows a wafer with the protective tape adhered to the stage.

The method begins by mounting the wafer 10 with the protective tape 14 adhered thereto on the stage 18, as shown in FIG. 6, at step 50. The surface of the wafer 10 opposite that to which the protective tape 14 is attached is in contact with the stage 18. Further, the wafer 10 is secured onto the stage 18 by vacuum.

Figure 7:
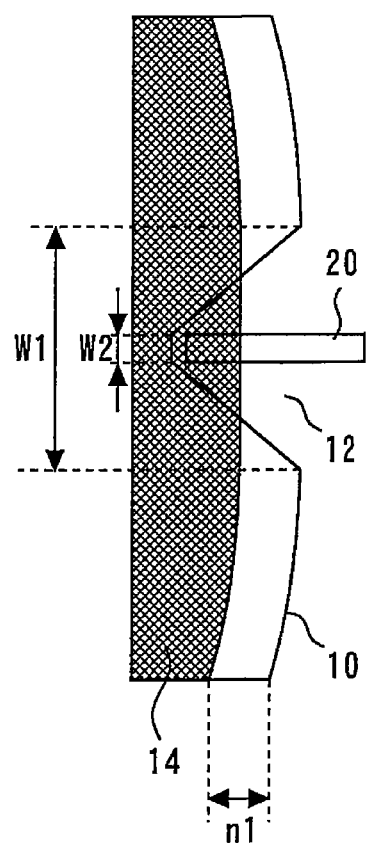
FIG. 7 is a plan view illustrating the positional relationship between the lift pin, the wafer, and the protective tape of the first embodiment.

FIG. 7 is a plan view illustrating the positional relationship between the lift pin 20, the wafer 10, and the protective tape 14 of the first embodiment. The top surface of the lift pin 20 is rectangular. The wafer 10 is mounted on the stage 18 so that the notch 12 of the wafer 10 overlaps a portion of the top surface of the lift pin 20. The width of the top surface of the lift pin 20 is less than the open width W1 of the notch 12, preferably equal to or less than the minimum width W2 of the notch 12. Since the top surface of the lift pin 20 has a relatively narrow width, the lift pin 20 can be inserted far into the notch 12. It should be noted that in FIG. 7, the reference numeral n1 denotes the width of the annular edge portion of the wafer 10 which is not covered by the protective tape 14. The width n1 is, e.g., approximately 0.5-1.0 mm. Thus, at step 50, the wafer 10 is mounted on the stage 18, with the wafer 10 having the protective tape 14 adhered thereto so that the tape overlaps only a portion of the notch 12 of the wafer 10. More specifically, the wafer 10 is mounted on the stage 18 so that the lift pin 20 is located immediately below the portion of the protective tape 14 overlapping the notch 12.

Figure 8:
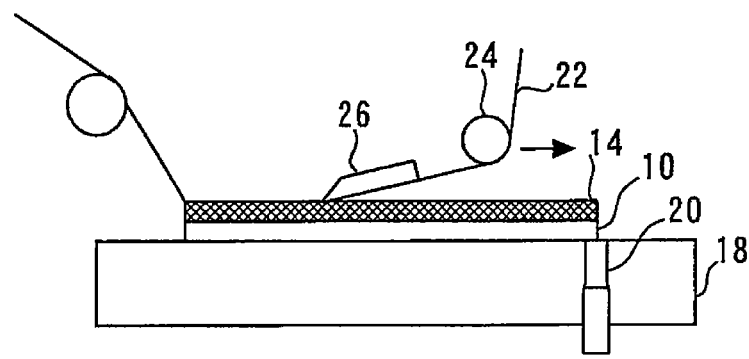
FIG. 8 shows the squeegee moving across the protective tape.
Figure 9:
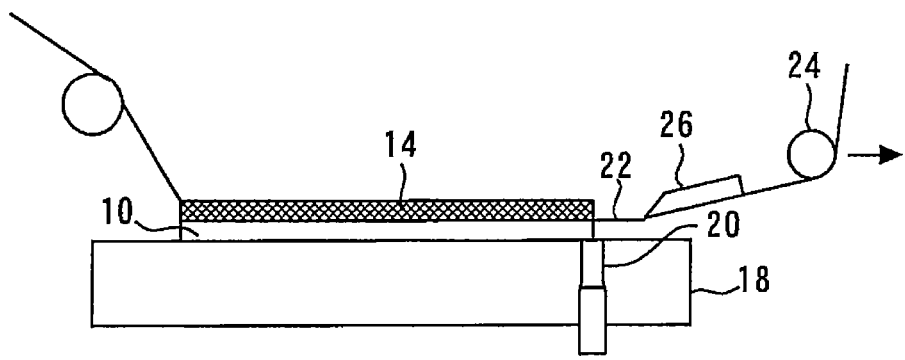
FIG. 9 shows the continuation of the movement.

After the completion of step 50, the method proceeds to step 51 where the peeling adhesive tape 22 is attached to the protective tape 14. Specifically, as shown in FIG. 8, the squeegee 26 is adjusted to a height corresponding to the height of the top surface of the protective tape 14 and moved across the protective tape 14 to bond the peeling adhesive tape 22 to the protective tape 14. This operation is continued until the peeling adhesive tape 22 is attached to and extends across the protective tape 14, as shown in FIG. 9. After the completion of bonding of the peeling adhesive tape 22, the operation of the roller 24 and the squeegee 26 is stopped.

Figure 10:
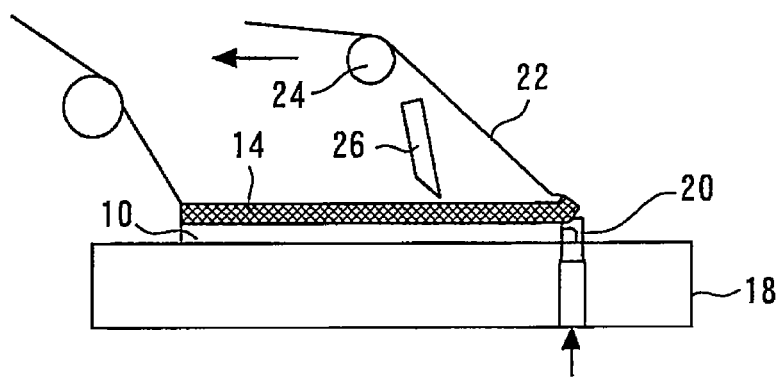
FIG. 10 shows the lift pin projected from the stage.
Figure 11:
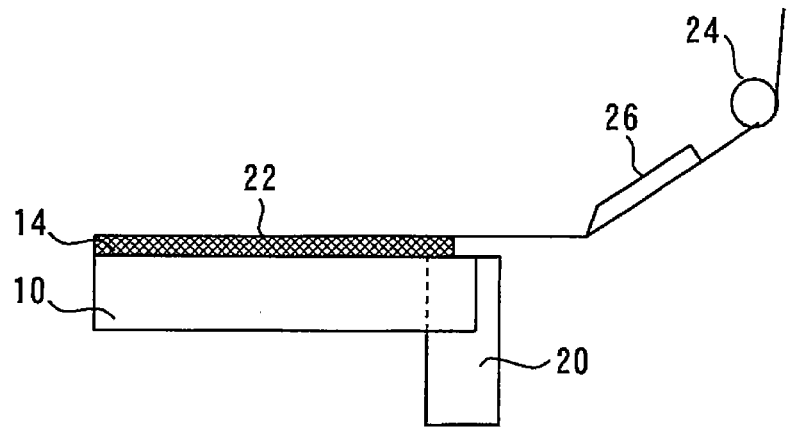
FIG. 11 is a cross-sectional view of the protective tape peeling apparatus of the first embodiment in operation before the lift pin is projected from the stage.
Figure 12:
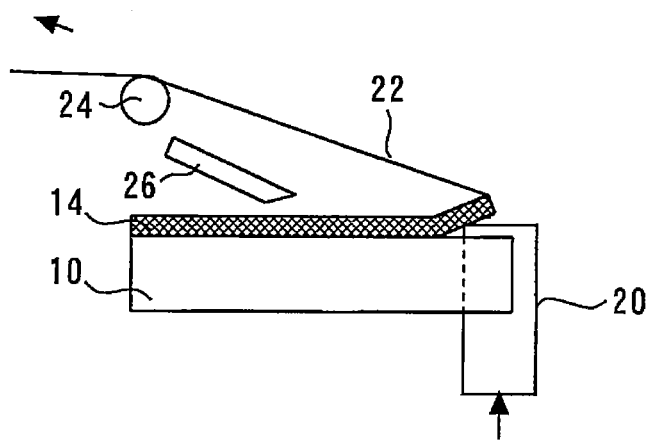
FIG. 12 is a cross-sectional view after the lift pin is projected from the stage.

After the completion of step 51, the method proceeds to step 52. At step 52, the lift pin 20 is projected from the stage 18 so that the portion of the protective tape 14 overlapping the notch 12 is raised by the top of the lift pin 20, as shown in FIG. 10. At that time, the rectangular top surface of the lift pin 20 comes into contact with the protective tape 14. FIG. 11 is a cross-sectional view of the protective tape peeling apparatus 16 of the first embodiment in operation before the lift pin 20 is projected from the stage 18. FIG. 12 is a cross-sectional view after the lift pin 20 is projected from the stage 18.

After the completion of step 52, the method proceeds to step 53 where, with the protective tape 14 raised by the lift pin 20, the peeling adhesive tape 22 is pulled so as to peel the protective tape 14 from the wafer 10. Specifically, the pulling force is applied such that it acts against the adhesive force between the peeling adhesive tape 22 and the protective tape 14 (and hence against the adhesive force between the protective tape 14 and the wafer 10). That is, the peeling adhesive tape 22 is pulled in a right-to-left direction as viewed in FIG. 10. Since pulling on the peeling adhesive tape 22 pulls the protective tape 14 adhered to the peeling adhesive tape 22, the protective tape 14 can be peeled off from the wafer 10, together with the peeling adhesive tape 22.

Figure 13:
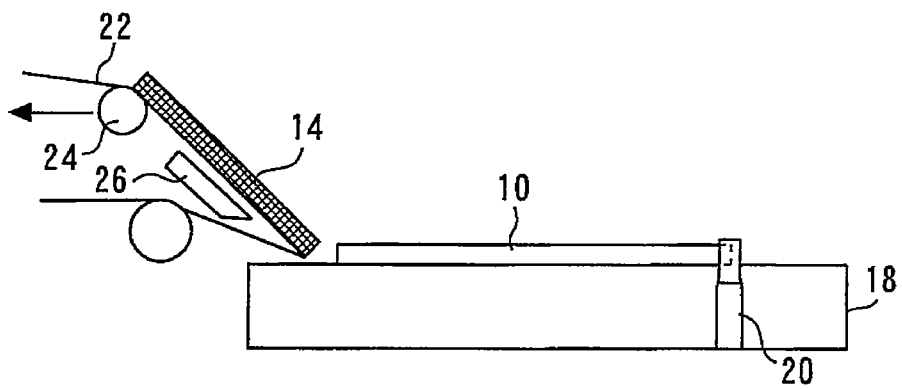
FIG. 13 shows the protective tape which is peeled off from the wafer.

In step 53, the protective tape 14 starts to peel from the wafer 10 at the portion where the protective tape 14 has been raised by the lift pin 20. As a result of step 53, the entire protective tape 14 is peeled off from the wafer 10 as shown in FIG. 13. This completes the description of the method and apparatus for peeling a protective tape according to the first embodiment.

In the first embodiment, since the protective tape 14 attached to the surface of the wafer 10 does not cover the peripheral portion of the wafer (i.e., the tape is attached only to a radially inner portion of the surface of the wafer 10), the protective tape 14 overlaps only a portion of the notch 12. However, the lift pin 20 is adapted to be inserted far into the notch 12, thereby allowing the contact area between the protective tape 14 and the lift pin 20 to be increased. This ensures that the portion of the protective tape 14 which overlaps the notch 12 can be raised by the lift pin 20. Therefore, it is possible to reliably remove the protective tape 14 from the wafer 10 even when the adhesion between the surface of the wafer 10 and the protective tape 14 is high.

It should be noted that the notch 12 typically has a size and shape that conform to applicable SEMI standards. In this example, the top surface of the lift pin 20 has dimensions of 3 mm×1.2 cm. The width of the lift pin 20 (3 mm in this example) should be no more than the minimum width W2 of the notch 12 shown in FIG. 7. That is, the lift pin 20 may have a width less than 3 mm. On the other hand, the length of the lift pin 20 is not limited to 1.2 cm, but may be any appropriate length.

Although in the first embodiment the peeling adhesive tape 22 begins to be pulled away from the wafer 10 after the lift pin 20 is projected from the stage 18, the present invention is not limited to this particular method. In other embodiments, the peeling adhesive tape 22 may begin to be pulled at the same time as the projecting of the lift pin 20. Further, the lift pin 20 may be raised after the pulling of the peeling adhesive tape 22 is begun.

Although in the first embodiment the top surface of the lift pin 20 is rectangular, the present invention is not limited to this particular shape. The invention only requires that the top surface of the lift pin 20 have a shape that allows it to raise the portion of the protective tape 14 which overlaps the notch 12. Therefore, the lift pin 20 may have a triangular or circular top surface.

Second Embodiment

Figure 16:
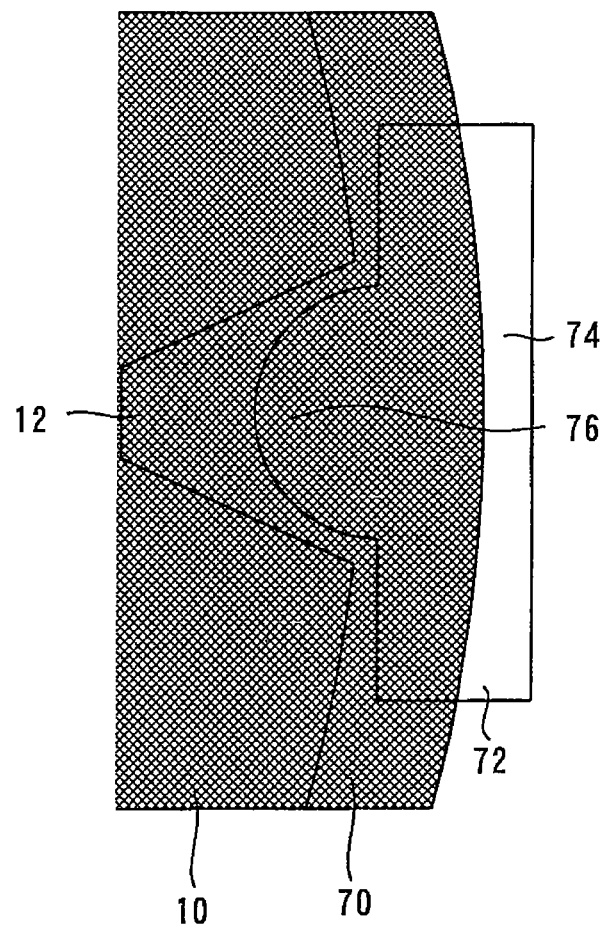
FIG. 16 is a view illustrating the positional relationship between the lift pin, the wafer, and the protective tape of the second embodiment.

With reference to FIGS. 14 to 16, there will be described a method and apparatus for peeling a protective tape according to a second embodiment of the present invention. It should be noted that like numerals are used to designate components corresponding to those described in the first embodiment. The following description will focus on the differences of the second embodiment from the first embodiment.

FIG. 14 is a plan view illustrating the positional relationship between a protective tape 70 and a wafer 10 of the second embodiment. The wafer 10 has a notch 12, as in the first embodiment. The protective tape 70 is attached to the surface of the wafer 10 so that it extends outwardly beyond the peripheral edge of the wafer 10. That is, the protective tape 70 has a first portion covering the notch 12 and a second portion extending outwardly from the peripheral edge of the wafer 10. The reason that the protective tape 70 extends beyond the peripheral edge of the wafer 10 is to prevent a crack or break in the edge of the wafer 10 due to impact applied thereto. Attachment of the protective tape 70 to the wafer 10 in this manner is referred to herein as "outer tape attachment."

FIG. 15 is a perspective view of a lift pin 72 of the second embodiment. The top surface of the lift pin 72 has a wide portion 74 and a narrow portion 76. The narrow portion 76 is of a semicircular configuration having a diameter R of less than 3 mm.

A protective tape peeling method of the second embodiment will now be described. The method begins by mounting the wafer 10 on the stage 18, with the wafer 10 having the protective tape 70 adhered thereto so that the tape extends beyond the peripheral edge of the wafer 10 (i.e., outer tape attachment). FIG. 16 is a view illustrating the positional relationship between the lift pin 72, the wafer 10, and the protective tape 70 of the second embodiment. As shown in FIG. 16, the first portion of the protective tape 70 overlaps the narrow portion 76 of the lift pin 72, and the second portion of the protective tape 70 overlaps the wide portion 74 of the lift pin 72.

Next, the peeling adhesive tape 22 is attached to the protective tape 70. The lift pin 72 is then projected from the stage 18 so that the first and second portions of the protective tape 70 are lifted by the top surface of the lift pin 72. The contact area between the projected lift pin 72 and the protective tape 70 is relatively large, since the top surface of the lift pin 72 is in contact with both the first and second portions of the protective tape 70. Specifically, the first portion of the protective tape 70 is raised by the narrow portion 76 of the lift pin 72, and the second portion of the protective tape 70 is raised by the wide portion 74 of the lift pin 72. With the protective tape 70 thus raised by the lift pin 72, the peeling adhesive tape 22 is pulled so as to peel the protective tape 70 from the wafer 10.

It should be noted that the wide portion 74 and the narrow portion 76 of the top surface of the lift pin 72 may have any suitable shapes and sizes. That is, the advantages of the present invention can be obtained when the narrow portion 76 raises the first portion of the protective tape 70 which covers the notch 12 while the wide portion 74 raises the second portion of the protective tape 70 which extends outwardly from the peripheral edge of the wafer 10. For example, the narrow portion 76 may be made rectangular in shape while still retaining the advantages of the invention. Further, the second embodiment is susceptible of alterations which are the same as or correspond to those that can be made to the first embodiment.

Thus the present invention allows easy removal of a protective tape adhered to the surface of a wafer even if the tape extends short of or beyond the peripheral edge of the wafer.

Obviously many modifications and variations of the present invention are possible in the light of the above teachings. It is therefore to be understood that within the scope of the appended claims the invention may be practiced otherwise than as specifically described.

What is claimed is:

1. A method of peeling a protective tape, comprising the steps of:
    mounting a wafer on a stage, said wafer having a notch, said protective tape adhered to said wafer so that a portion of said protective tape overlaps a portion of said notch of said wafer, wherein said portion of said notch is less than all of said notch;
    attaching a peeling adhesive tape to said protective tape;
    projecting a lift pin from said stage so that the portion of said protective tape which overlaps said portion of said notch is raised by a top surface of said lift pin; and with said protective tape raised by said lift pin, pulling said peeling adhesive tape so as to peel said protective tape from said wafer;

wherein said top surface of said lift pin has a shape that allows said top surface to raise said portion of said protective tape which overlaps said notch.

2. The method according to claim 1, wherein said top surface of said lift pin has a width equal to or less than a minimum width of said notch.

3. A method of peeling a protective tape, comprising the steps of:

mounting a wafer, the wafer having said protective tape adhered thereto, on a stage, said protective tape having a first portion covering a notch of said wafer, said protective tape also having a second portion extending outwardly from a peripheral edge of said wafer;

attaching a peeling adhesive tape to said protective tape;

projecting a lift pin from said stage so that said first and second portions are raised by a top surface of said lift pin; and with said protective tape raised by said lift pin, pulling said peeling adhesive tape so as to peel said protective tape from said wafer;

wherein said top surface of said lift pin has a narrow portion and a wide portion that is wider than said narrow portion, so that said first portion is raised by said narrow portion and said second portion is raised by said wide portion.

* * * * *